US012203645B2

(12) United States Patent
Kato et al.

(10) Patent No.: US 12,203,645 B2
(45) Date of Patent: Jan. 21, 2025

(54) LIGHT-EMITTING APPARATUS

(71) Applicant: Sharp Fukuyama Laser Co., Ltd., Fukuyama (JP)

(72) Inventors: Masahiro Kato, Fukuyama (JP); Hiroyoshi Higashisaka, Fukuyama (JP); Hiroki Orita, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 422 days.

(21) Appl. No.: 17/680,652

(22) Filed: Feb. 25, 2022

(65) Prior Publication Data
US 2022/0341583 A1    Oct. 27, 2022

(30) Foreign Application Priority Data

Apr. 23, 2021 (JP) ................................. 2021-073476

(51) Int. Cl.
| | |
|---|---|
| *H01L 33/62* | (2010.01) |
| *F21V 5/00* | (2018.01) |
| *F21V 5/04* | (2006.01) |
| *F21V 31/00* | (2006.01) |
| *H01S 5/00* | (2006.01) |
| *F21Y 115/30* | (2016.01) |

(52) U.S. Cl.
CPC ............ *F21V 31/005* (2013.01); *F21V 5/007* (2013.01); *F21V 5/045* (2013.01); *H01S 5/00* (2013.01); *F21Y 2115/30* (2016.08)

(58) Field of Classification Search
CPC ................. H01S 5/0233; H01S 5/0235; H01S 5/18388; H01L 2924/12042; H01L 2924/12041; H01L 33/483; H01L 33/62; H01L 2924/16251; H01L 2924/163
See application file for complete search history.

(56) References Cited

U.S. PATENT DOCUMENTS

| | | | |
|---|---|---|---|
| 10,930,820 B2 * | 2/2021 | Kozuru | ................... H01L 33/54 |
| 2004/0195580 A1 * | 10/2004 | Nishizawa | .......... H01S 5/02257 257/99 |
| 2005/0013562 A1 * | 1/2005 | Tatehata | ............ H01L 31/02325 385/93 |

(Continued)

FOREIGN PATENT DOCUMENTS

JP     2005-101481 A    4/2005

*Primary Examiner* — Jaehwan Oh
(74) *Attorney, Agent, or Firm* — ScienBiziP, P.C.

(57) ABSTRACT

A light-emitting apparatus includes: a body having an inner space and an opening, the body incorporating at least one semiconductor laser element the body being made of a metal; and a sealing glass member joined to the body, to hermetically seal the inner space. The sealing glass member has a surface adjacent to the body, the surface of the sealing glass member being provided with a base joint layer in a joint region where the sealing glass member and the body are joined together, the base joint layer being made of a metal having a thermal expansion coefficient that falls between a thermal expansion coefficient of the sealing glass member and a thermal expansion coefficient of the metal constituting the body. The sealing glass member is joined to the body with the base joint layer and a solder-containing joint layer interposed between the sealing glass member and the body.

10 Claims, 9 Drawing Sheets

(56) References Cited

U.S. PATENT DOCUMENTS

| | | | |
|---|---|---|---|
| 2012/0139001 A1* | 6/2012 | Eberhardt | C03C 27/06 438/46 |
| 2015/0103856 A1* | 4/2015 | Hagino | H01S 5/02345 372/44.01 |
| 2016/0285232 A1* | 9/2016 | Reinert | H01S 5/4025 |
| 2017/0338628 A1* | 11/2017 | Matsushita | H01S 5/4025 |
| 2018/0122995 A1* | 5/2018 | Koyama | H01L 33/483 |
| 2018/0182928 A1* | 6/2018 | Namie | H01S 5/02257 |
| 2019/0123509 A1* | 4/2019 | Hashimoto | H01S 5/405 |

* cited by examiner

1: SEMICONDUCTOR LASER ELEMENT
2: SUB-MOUNT
3: MOUNT
4: PIN
5: WIRE
10: BODY
11: INNER SPACE
13: OPENING
14: BOTTOM SURFACE
15a, 15b: POSITIONING HOLE

20: LENS ARRAY
30: BASE LAYER
31: ADHERENCE LAYER
32: BARRIER LAYER
33: METAL JOINT LAYER
40: SOLDER LAYER
50: JOINT REGION

10: BODY
11: INNER SPACE
12: EXIT SURFACE
13: OPENING
16: COUNTERSUNK DEPRESSION
16a: BOTTOM SURFACE
17: GROOVE
102: LIGHT-EMITTING APPARATUS

LIGHT-EMITTING APPARATUS

CROSS-REFERENCE TO RELATED APPLICATION

The present application claims priority from Japanese Patent Application Number 2021-73476, the content of which is hereby incorporated by reference into this application.

BACKGROUND OF THE INVENTION

Field of the Invention

The present invention relates to a light-emitting apparatus.

Description of the Related Art

A known light-emitting apparatus uses semiconductor laser elements as laser-light emitters. Such a light-emitting apparatus needs to have a light-transparency window for taking out laser light and have semiconductor laser elements sealed hermetically. Japanese Unexamined Patent Application Publication No, 2005-101481 discloses a semiconductor-device cap with a light-transparency window joined to the metal body of the cap by a sealant, which is herein a glass member having a low melting point. This semiconductor-device cap is applicable to such a light-emitting apparatus.

SUMMARY OF THE INVENTION

The foregoing known technique is suitable for joining a light-transparency window to a semiconductor-device cap but is unsuitable for joining a light-transparency window to the package body of a light-emitting apparatus. A package body made of a metal mainly containing copper (Cu) for the sake of enhancement in the heat dissipation capability of the package body has a large difference in thermal expansion coefficient between the package body and a light-transparency window of glass (sealing glass member), and the light-transparency window is hence unfortunately damaged by a thermal stress.

To solve the above known problem, it is an object of one aspect of the present invention to achieve a light-emitting apparatus having a body that is sealable by a sealing glass member without damaging the sealing glass member even when there is a large difference in thermal expansion between the body and sealing glass member of the light-emitting apparatus.

To solve the above problem, a light-emitting apparatus according to one aspect of the present invention includes a body having an inner space and an opening penetrating the inner space and the outside. The body incorporates at least one semiconductor laser element within the inner space and is made of a metal. The light-emitting apparatus also includes a sealing glass member joined to the body so as to cover the opening, to hermetically seal the inner space of the body. The sealing glass member has a surface adjacent to the body. The surface of the sealing glass member is provided with a base joint layer in a joint region Where the sealing glass member and the body are joined together. The base joint layer is made of a metal having a thermal expansion coefficient that falls between the thermal expansion coefficient of the sealing glass member and the thermal expansion coefficient of the metal constituting the body. The sealing glass member is joined to the body with the base joint layer and a solder-containing joint layer interposed between the sealing glass member and the body.

A method for manufacturing a light-emitting apparatus according to another aspect of the present invention includes joining a sealing glass member to a body so as to cover an opening, to hermetically seal an inner space of the body. The body has the inner space and the opening penetrating the inner space and the outside. The body incorporates at least one semiconductor laser element within the inner space and is made of a metal. The sealing glass member has a surface adjacent to the body. The surface of the sealing glass member is provided with a base layer with a joint region patterned in advance, and a solder layer disposed on the base layer. The joint region includes the sealing glass member and the body joined together. The base layer is made of a metal having a thermal expansion coefficient that falls between the thermal expansion coefficient of the sealing glass member and the thermal expansion coefficient of the metal constituting the body. The base layer includes an adherence layer disposed on the surface of the sealing glass member, a barrier layer disposed on the adherence layer, and a metal joint layer disposed on the barrier layer. The body has a surface covered, at least in the joint region, with a gold layer in advance. The joining step includes heating the joint region to alloy the metal joint layer and the solder layer together and alloy the solder layer and the gold layer together.

The aspects of the present invention achieve a light-emitting apparatus having a body that is sealable by a sealing glass member without damaging the sealing glass member even when there is a large difference in thermal expansion between the body and sealing glass member of the light-emitting apparatus.

DETAILED DESCRIPTION OF THE INVENTION

First Preferred Embodiment

Figure 1:
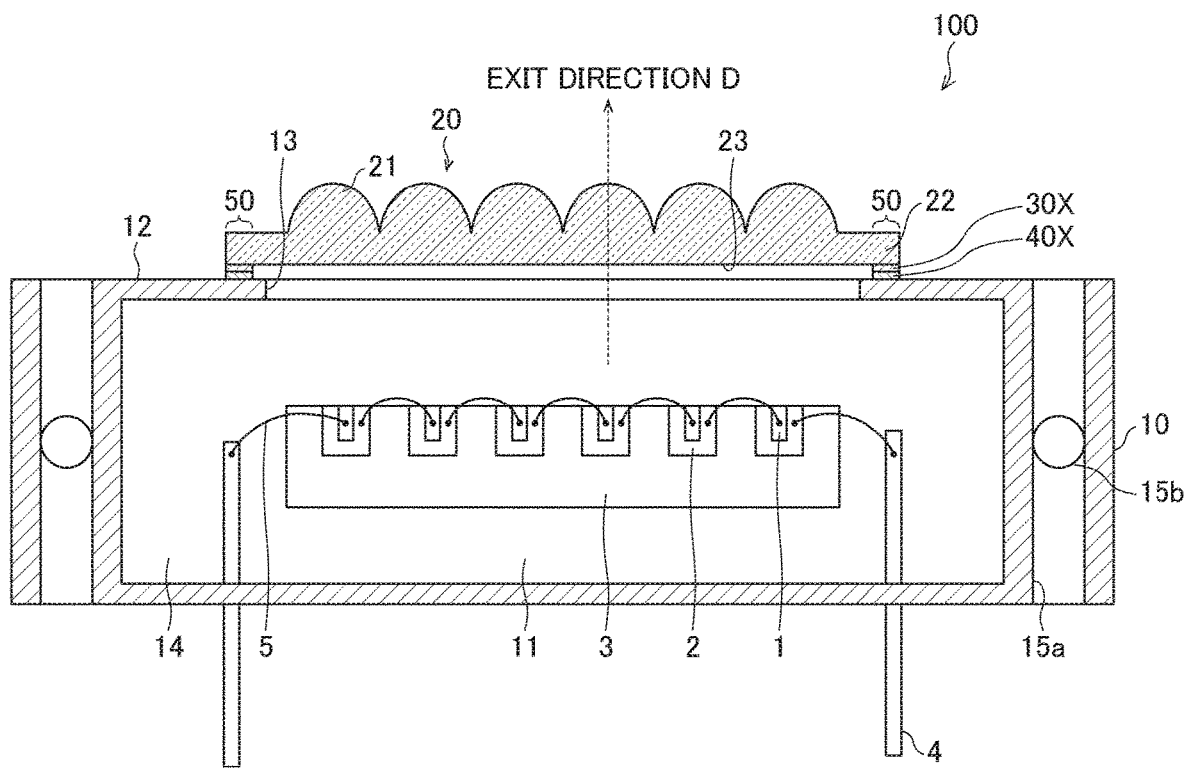
FIG. 1 is a sectional view of an example schematic configuration of a light-emitting apparatus according to a first preferred embodiment of the present invention.

Some of butterfly multi-chip packages (MCPs) distributed currently each incorporate a light-emitting apparatus having a body with its inner space sealed hermetically by a sealant (e.g., cap glass) and having a lens array fixed on the sealant by an adhesive.

One aspect of the present invention in contrast provides a light-emitting apparatus 100 having a body 10 with its inner space 11 sealed hermetically by not a sealant but a lens array 20. This eliminates the need to allocate a sealant mounting space separately from the lens array 20. This also reduces sealants, thereby reducing one process step for manufacture.

However, sealing the inner space 11 of the body 10 hermetically with the lens array 20 involves the following problem. That is, the body 10, when made of copper, has a thermal expansion coefficient of $17.7 \times 10^{-6}$ [1/K], and the lens array 20 (glass) has a thermal expansion coefficient of $7.2 \times 10^{-6}$ [1/K]; there is thus a large difference in thermal expansion between these components. If hence joined to the body 10 directly using only the solder layer 40, the lens array 20 directly receives a thermal stress due to the thermal expansion difference between the body 10 and lens array 20. This possibly damages the lens array 20.

One aspect of the present invention provides the following configuration so that the body 10 can be sealed hermetically by the lens array 20 even when there is a large difference in thermal expansion between the body 10 and lens array 20. That is, the light-emitting apparatus 100 according to one aspect of the present invention includes a base layer 30 made of a metal having a thermal expansion coefficient that falls between the thermal expansion coefficient of the lens array 20 and the thermal expansion coefficient of a metal constituting the body 10 between the lens array 20 and solder layer 40. This can reduce a thermal stress resulting from the thermal expansion difference between the body 10 and lens array 20, thereby lowering the risk of damaging the lens array 20. The following describes the details.

Light-Emitting Apparatus

Figure 2:
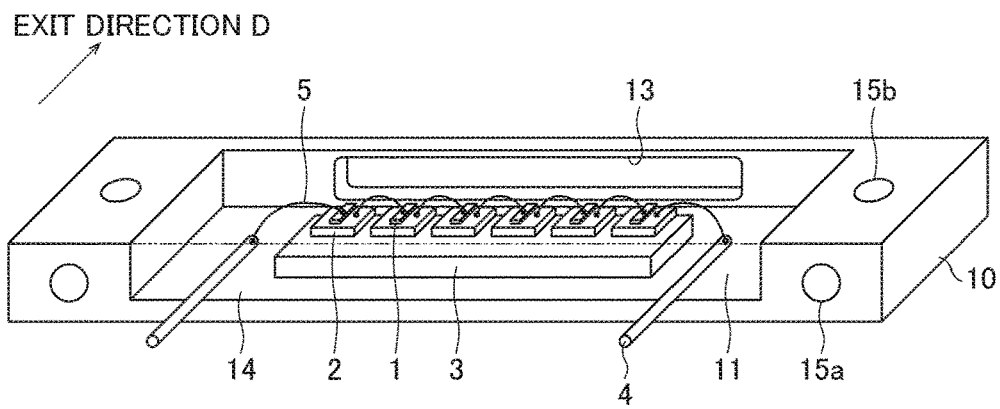
FIG. 2 is a perspective view of the example schematic configuration of the light-emitting apparatus.

One preferred embodiment of the present invention will be detailed based on FIGS. 1 and 2. FIG. 1 is a sectional view of an example schematic configuration of the light-emitting apparatus 100 according to the first preferred embodiment of the present invention. FIG. 2 is a perspective view of the example schematic configuration of the light-emitting apparatus 100.

FIG. 1 is a sectional view taken along a plane parallel to an exit direction D, in which light exits outside from the light-emitting apparatus 100, and illustrates, in section, the state of wire connection to semiconductor laser elements 1. FIGS. 4 to 9 are illustrated similarly. The plane parallel to the exit direction D, in which light exits outside from the light-emitting apparatus 100, is a plane parallel to a bottom surface 14 of the body 10. Here, the bottom surface 14 is a dissipation surface from which heat radiated by the semiconductor laser elements 1 is dissipated. FIG. 2 illustrates the body 10 that is transparent above and at the front of the inner space 11 on the drawing sheet, in order for those who reads and views the Specification and Drawings to easily understand the inside of the inner space 11 of the body 10.

The light-emitting apparatus 100 includes a plurality of semiconductor laser elements 1. Light beams from the semiconductor laser elements 1 are individually and independently collimated by the lens array 20 and are collected on a lens of a device having the light-emitting apparatus 100, to thus constitute a single laser light beam in the end for use. The light-emitting apparatus 100 can be used in devices that require a peak output, such as a projector, an illumination device for indoor and outdoor use, a vehicle-installed headlight, and a phototransmitter.

As illustrated in FIGS. 1 and 2, the light-emitting apparatus 100 includes the body 10 and the lens array 20. The body 10 and the lens array 20 are joined together by a joint region 50, which is located between the body 10 and lens array 20.

Body

The body 10 is a substantially rectangular parallelepiped casing of metal having the inner space 11. The body 10 has an exit surface (outer surface) 12 located in the exit direction D, in which light exits outside from the body 10. The exit surface 12 has an opening 13 penetrating the inner space 11 and the outside. The opening 13 desirably has an aperture area that allows most of light emitted from the semiconductor laser elements 1 of the body 10 to pass through the opening 13. The opening 13 may have any shape. The opening 13 in this preferred embodiment is substantially rectangular. As illustrated in FIG. 2, the body 10 may have positioning holes 15a and 15b for use in positioning. The positioning holes 15a penetrate the body 10 in a direction substantially parallel to the exit direction D, and the positioning holes 15b penetrate the body 10 so as to be orthogonal to the positioning holes 15a and bottom surface 14.

The body 10 is desirably made of a metal containing copper (Cu) as a main constituent. In the present application, a major constituent refers to a constituent having an atomic composition percentage of 50 at % or more. This enables heat radiated by the semiconductor laser elements 1 to dissipate outside from the bottom surface 14 efficiently. Although not shown, the body 10 has a surface plated with, for instance, gold (Au)-containing metal.

The plurality of semiconductor laser elements 1 are placed within the inner space 11 of the body 10. The number of semiconductor laser elements 1 is not limited to what is illustrated in the drawing; at least one semiconductor laser element 1 needs to be placed within the inner space 11.

The semiconductor laser elements 1 emit laser light. In this preferred embodiment, the semiconductor laser elements 1 emit light in the exit direction D, which is substantially parallel to the layers of a laminated structure of each semiconductor laser element 1, and the emitted light passes through the lens array 20, described later on, and then travels in the exit direction D to exit outside from the body 10.

In some preferred embodiments, the diction of exit of light emitted from the semiconductor laser elements 1 does not have to be the same as the direction of exit of light emitted from the body 10 to the outside. Light may be emitted from the body 10 to a direction where the layers of the semiconductor laser element 1 are laminated, and go outside, by reflecting light emitted from the semiconductor laser elements 1 on a mirror or other things. Accordingly, one aspect of the present invention is applicable also to a butterfly multi-chip packages.

The semiconductor laser elements 1 are placed within the inner space 11 of the body 10 in the following manner more specifically. For instance, a mount 3 is formed so as to be integrated into the body 10 during the process of cutting the body 10. In addition, the semiconductor laser elements 1 are mounted onto sub-mounts 2; which are insulators, and the sub-mounts 2 are then joined onto the mount 3. This provides the semiconductor laser elements 1 placed within the inner space 11 of the body 10 and enables heat generated by the semiconductor laser elements 1 to dissipate outside efficiently from the sub-mounts 2 via the body 10.

The plurality of semiconductor laser elements 1 are aligned in the body 10. The semiconductor laser elements 1 adjacent to each other are electrically connected together by a wire 5 via the sub-mount 2, The semiconductor laser elements 1 at both ends are electrically connected to respective pins 4 through the respective wires 5. The pins 4 are terminals for electrically connecting the semiconductor laser elements 1 to the outside of the light-emitting apparatus 100, The pins 4 are fixed to the body 10 by, for instance, a hermetic seal to be insulated from the body 10.

The lens array 20 (sealing glass member) is joined to the body 10 with the base layer 30 and solder layer 40, described later on, interposed therebetween so as to cover the opening 13, thereby hermetically sealing the inner space 11 of the body 10. The lens array 20 is larger than the opening 13 and can thus cover the opening 13.

The lens array 20 includes as many lenses 21 as the semiconductor laser elements 1, and a joint 22 located around the lenses 21. The lens array 20 includes the lenses 21 in a location through which light emitted from the semiconductor laser elements 1 passes. The plurality of lenses 21 are aligned continuously and integrated with the joint 22.

Although the lenses 21 each may have any shape, each lens 21 has such a shape that laser light from the corresponding semiconductor laser element 1 can be collimated. The lens array 20 can be made of a material having light transparency, such as glass or synthetic quartz.

Joint Region

The joint region 50 includes a base joint layer 30X and a joint layer 40X both joining the body 10 and lens array 20 together. The joint region 50 on a surface 23 of the lens array 20 extends along the outer edge of the lens array 20 so as to correspond to the perimeter of an opening constituting the opening 13. The joint region 50 on the exit surface 12 of the body 10 extends along the perimeter of the opening constituting the opening 13 so as to correspond to the outer edge of the lens array 20.

In the joint region 50, the base layer 30 and solder layer 40 (described later on) and the plating of the body 10 are heated together to be partly mixed and integrated together to form an alloy, thus joining the body 10 and lens array 20 together. This alloy formation may be eutectic formation for instance. The joint region 50 after the heating includes the base joint layer 30X and the joint layer 40X.

The base joint layer 30X herein is the base layer 30 (described later on) partly integrated with and thus inseparable from the solder layer 40 as a result of the alloy formation, in addition, the joint layer 40X herein is the solder layer 40 (described later on) integrated with part of the base layer 30 and thus inseparable from the base layer 30 as a result of the alloy formation. The details will be described later on.

Base Layer and Base Joint Layer

The base joint layer 30X is made of a metal having a thermal expansion coefficient that falls between the thermal expansion coefficient of the lens array 20 and the thermal expansion coefficient of the metal constituting the body 10. The base joint layer 30X in the joint region 50, where the body 10 and the lens array 20 are joined together, is disposed on the surface 23 of the lens array 20, which is adjacent to the body 10, so as to extend along the outer edge of the lens array 20. In other words, the base joint layer 30X is disposed on the surface 23 of the lens array 20 so as to correspond to the perimeter of the opening 13.

Figure 3:
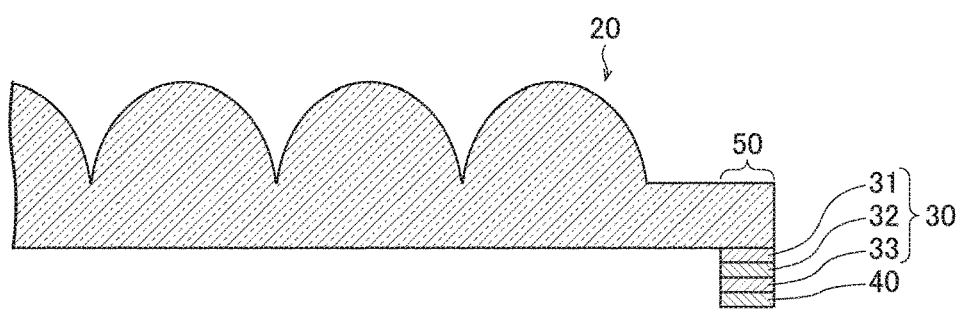
FIG. 3 is a sectional view of a schematic configuration of a base layer and solder layer before alloy formation in a joint region of the light-emitting apparatus.

As illustrated in FIG. 3, the base joint layer 30X before alloyed is the base layer 30 that includes an adherence layer 31, a barrier layer 32, and a metal joint layer 33, which are stacked sequentially in a direction going away from the lens array 20. FIG. 3 is a sectional view of the schematic configuration of the base layer 30 and solder layer 40 before alloy formation performed in the joint region of the light-emitting apparatus 100.

The adherence layer 31 is a metal layer disposed on the surface 23 of the lens array 20 and provided for bringing the lens array 20 and base layer 30 into close contact with each other. A usable example of the metal constituting the adherence layer 31 is a metal mainly containing chromium (Cr) or titanium (Ti). Chromium has a thermal expansion coefficient of $11.3 \times 10^{-6}$ [1/K], which falls between the thermal expansion coefficient of copper, the major constituent of the body 10 in the preferred embodiment, and the thermal expansion coefficient of glass, the major constituent of the lens array 20.

The barrier layer 32 is a metal layer disposed on the adherence layer 31, between the adherence layer 31 and metal joint layer 33 and is provided for avoiding the adherence layer 31 and solder layer 40 from mixture during alloy formation. This can maintain the adhesion between the base layer 30 and lens array 20, thereby enabling the lens array 20 to seal the body 10 firmly.

A usable example of the metal constituting the barrier layer 32 is a metal mainly containing platinum (Pt). Platinum has a thermal expansion coefficient of $8.8 \times 10^{-6}$ [1/K], which falls between the thermal expansion coefficient of copper and the thermal expansion coefficient of glass.

The metal joint layer 33 is a metal layer and is provided for alloying, through heating, the solder layer 40 and at least part of the metal joint layer 33. A usable example of the metal constituting the metal joint layer 33 is a metal mainly containing gold. Gold has a thermal expansion coefficient of $14.2 \times 10^{-6}$ [1/K], which falls between the thermal expansion coefficient of copper and the thermal expansion coefficient of glass.

After the base layer 30 is heated to be alloyed together with the solder layer 40, the adherence layer 31 and the barrier layer 32 each can be identified as an individual layer, but in some cases, the metal joint layer 33, which is integrated into the solder layer 40, cannot be identified individually. In this preferred embodiment, the base layer 30 after alloyed is referred to as the base joint layer 30X.

Solder Layer and Joint Layer

The joint layer 40X is composed of the solder layer 40 at least partly alloyed, through heating, with part of the base layer 30 and with part of the plating of the body 10. The joint layer 40X joins the body 10 and lens array 20 together. The solder layer 40 contains solder and is furthermore made of a metal mainly containing, for instance; any one of gold, gold and tin (Sn), or tin, silver (Ag) and copper. Gold has a thermal expansion coefficient of $14.2 \times 10^{-6}$ [UK], which falls between the thermal expansion coefficient of copper and the thermal expansion coefficient of glass.

The solder layer 40 in some cases can be no longer identified individually after heated to be alloyed with the metal joint layer 33, because the metal joint layer 33 and solder layer 40 are integrated together. In this preferred embodiment, the solder layer 40 after alloyed is referred to as the joint layer 40X. The base layer 30 and solder layer 40 before alloyed respectively constitute the base joint layer 30X and joint layer 40X after they are alloyed, and in the joint region 50, these layers join the body 10 and lens array 20 together.

Example Material and Thickness of Each Layer

The following lists, by way of example, the material and thickness of each layer when the major constituent of the body 10 is copper: for the adherence layer 31, a metal mainly containing chromium, and a thickness of 0.1 μm or more; for the barrier layer 32, a metal mainly containing platinum, and a thickness of 0.2 μm or more; for the metal joint layer 33, a metal mainly containing gold, and a thickness of 0.5 μm or more; for the solder layer 40, a metal containing gold and tin, and a thickness of 15 μm or more; and for the body 10, several micrometers of gold plating (gold layer).

Method for Manufacturing Light-Emitting Apparatus

Figure 4:
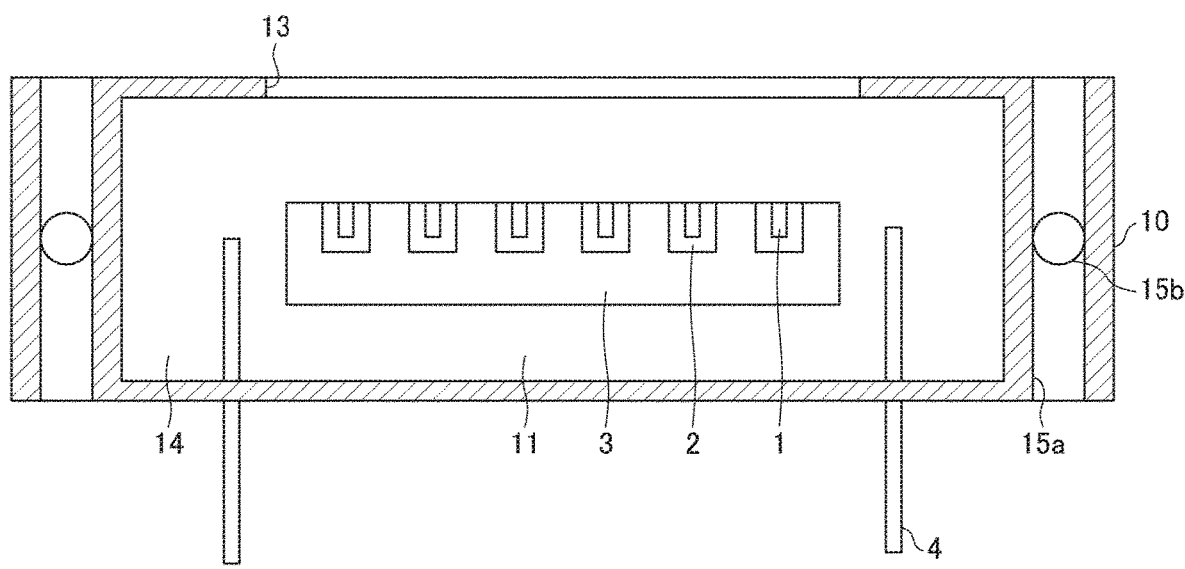
FIG. 4 illustrates, in a sectional view, an example process step included in a method for manufacturing the light-emitting apparatus.

A method for manufacturing the light-emitting apparatus 100 will be described based on FIGS. 4 to 7. FIG. 4 illustrates, in a sectional view, an example process step included in the method for manufacturing the light-emitting apparatus 100. FIGS. 5 to 8 each illustrate a subsequent process step in a sectional view.

The first process step is placing at least one semiconductor laser element 1 into the inner space 11 of the body 10. Here, the body 10 is made of a metal and has the inner space 11 and the opening 13, which penetrates the inner space 11 and the outside. The body 10 is plated with a gold layer in advance. This placement step is performed with the pins 4 laid on the body 10.

To be specific, the placement step includes placing a plurality of semiconductor laser elements 1 mounted on the respective sub-mounts 2 in advance onto the mount 3 integrated with the body 10. This provides the plurality of semiconductor laser elements 1 placed in the body 10. The height of the mount 3 from the bottom surface 14 is designed in such a manner that most of light emitted from the semiconductor laser elements 1 placed in the body 10 passes through the opening 13, and the mount 3 is formed in the body 10.

Figure 5:
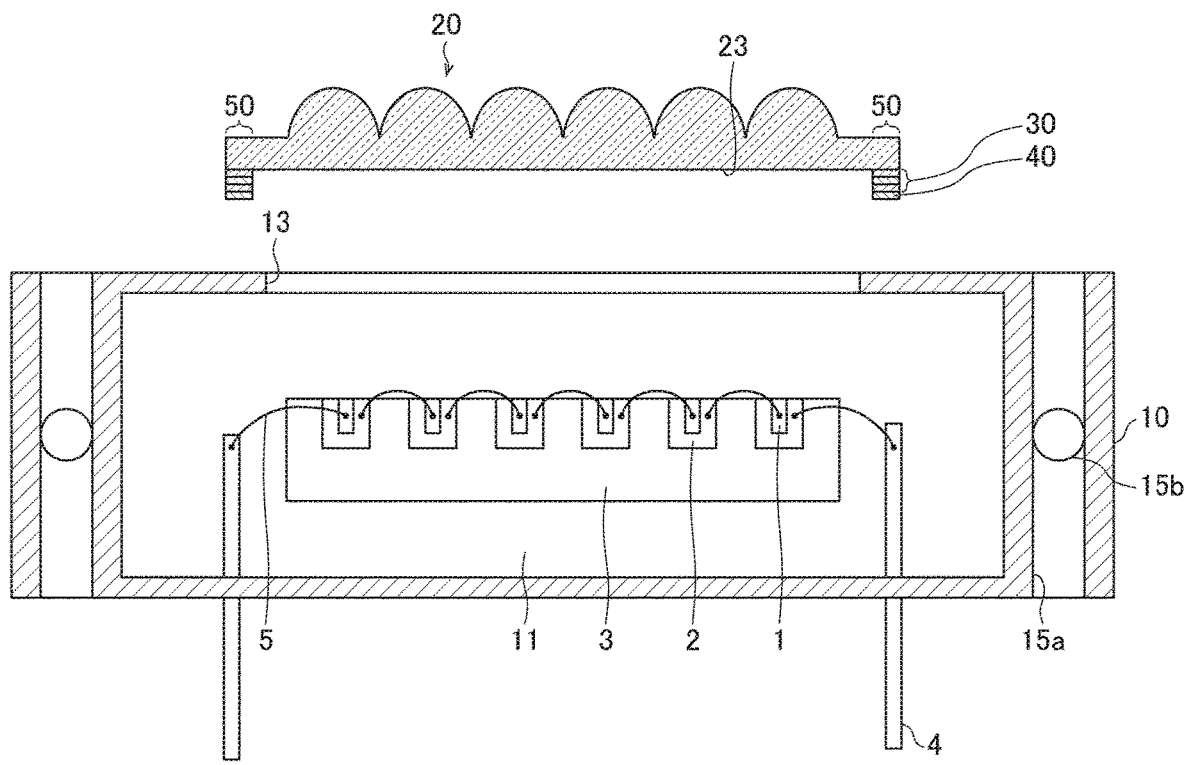
FIG. 5 illustrates, in a sectional view, an example process step included in the method and subsequent to the process step illustrated in FIG. 4.

The next process step is electrically connecting the individual semiconductor laser elements 1 to the pins 4 through the wires 5, as illustrated in FIG. 5.

As illustrated in FIG. 5, the next process step is base layer formation. This formation step includes forming the base layer 30 with the joint region 50, where the lens array 20 and body 10 are joined together, being patterned in advance, onto the surface 23 of the lens array 20 adjacent to the body 10, and forming the solder layer 40 onto the base layer 30. To be specific, the formation step includes forming the adherence layer 31 onto the surface 23 of the lens array 20, followed by forming the barrier layer 32 onto the adherence layer 31, followed by forming the metal joint layer 33 onto the barrier layer 32 to thus form the base layer 30, and forming the solder layer 40 onto the metal joint layer 33.

In some preferred embodiments, the base layer 30 and the solder layer 40 may be both formed on the body 10, or only the solder layer 40 may be formed on the body 10. The base layer 30 needs to be formed close to the lens array 20 between the lens array 20 and body 10, and the solder layer 40 needs to be formed close to the body 10.

Figure 6:
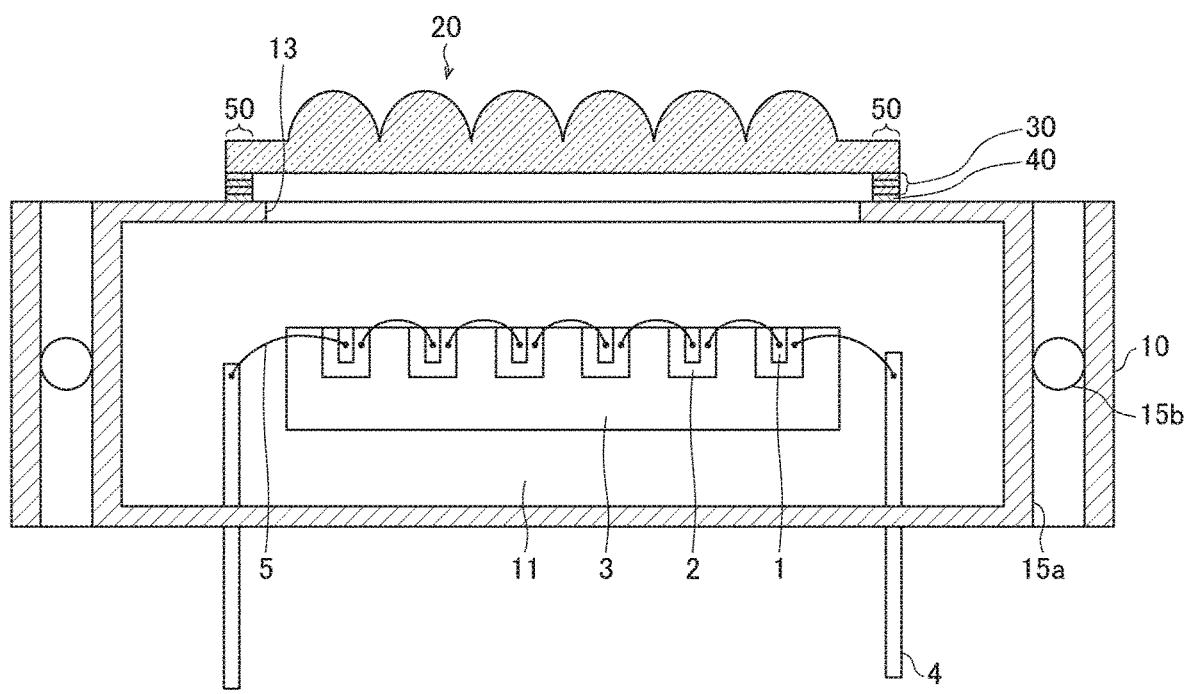
FIG. 6 illustrates, in a sectional view, an example process step included in the method and subsequent to the process step illustrated in FIG. 5.

The next process step is, as illustrated in FIG. 6; positioning the lens array 20 to the body 10 in such a manner that the lenses 21 are fixed in respective locations through which light rays emitted from the respective semiconductor laser elements 1 pass, and heating the joint region 50. The heating may be performed through any way; only the base layer 30 and solder layer 40 may be heated, or the entire light-emitting apparatus 100 may be heated. Specific examples of the heating include the following two ways. One of the two ways is heating the body 10 to the melting point of the solder layer 40; in this case, the body 10 undergoes the heating, followed by placement of the lens array 20 of room temperature. The other way is heating only the joint region 50 through pinpoint irradiation with a high-output laser beam from outside, with the lens array 20 mounted on the body 10.

Figure 7:
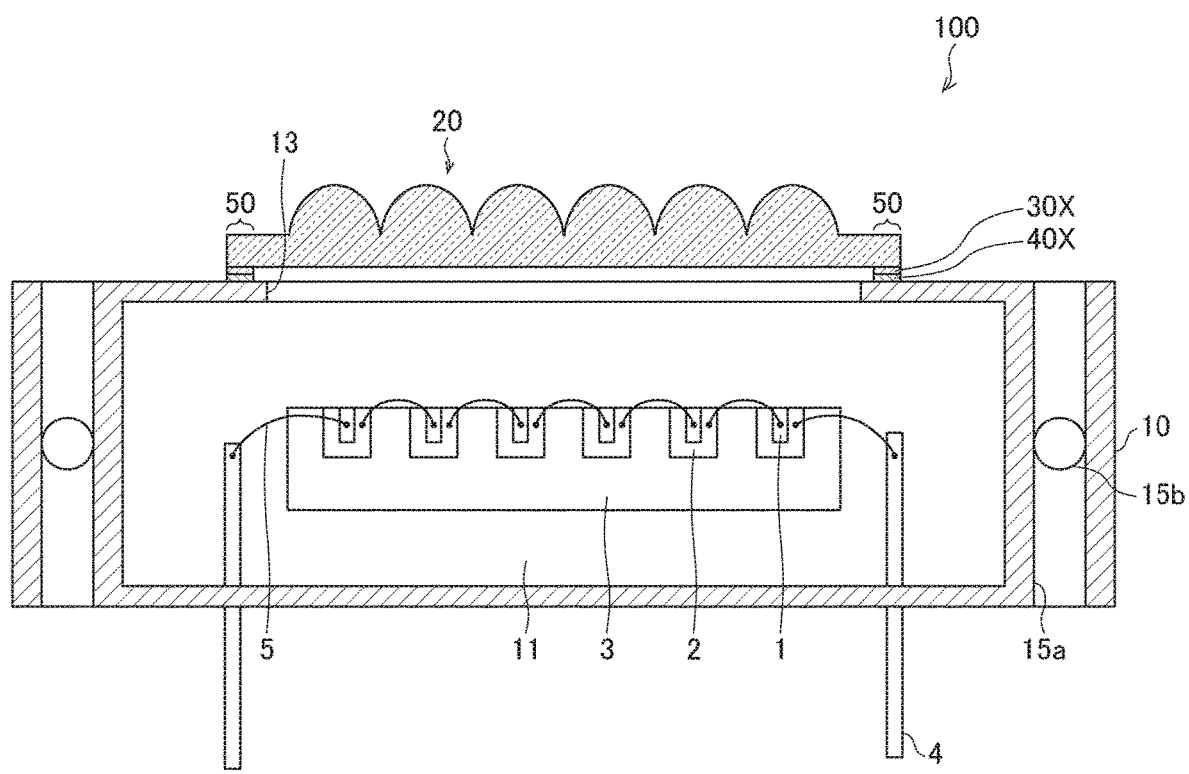
FIG. 7 illustrates, in a sectional view, an example process step included in the method and subsequent to the process step illustrated in FIG. 6.

Such heating alloys the metal joint layer 33 and solder layer 40 together as well as the solder layer 40 and gold layer together, thus joining the lens array 20 to the body 10 in the joint region 50. This forms the base joint layer 30X and joint layer 40X in the joint region 50 between the body 10 and lens array 20, as illustrated in FIG. 7. As a result, the lens array 20 is joined to the body 10 so as to cover the opening 13, to thus hermetically seal the inner space 11 of the body 10 (this process step is called hermetic sealing). This completes the light-emitting apparatus 100.

Second Preferred Embodiment

The following describes a second preferred embodiment of the present invention. For convenience in description, components having the same functions as those described in the foregoing preferred embodiment will be denoted by the same signs, and the description of the same components will not be repeated.

Figure 8:
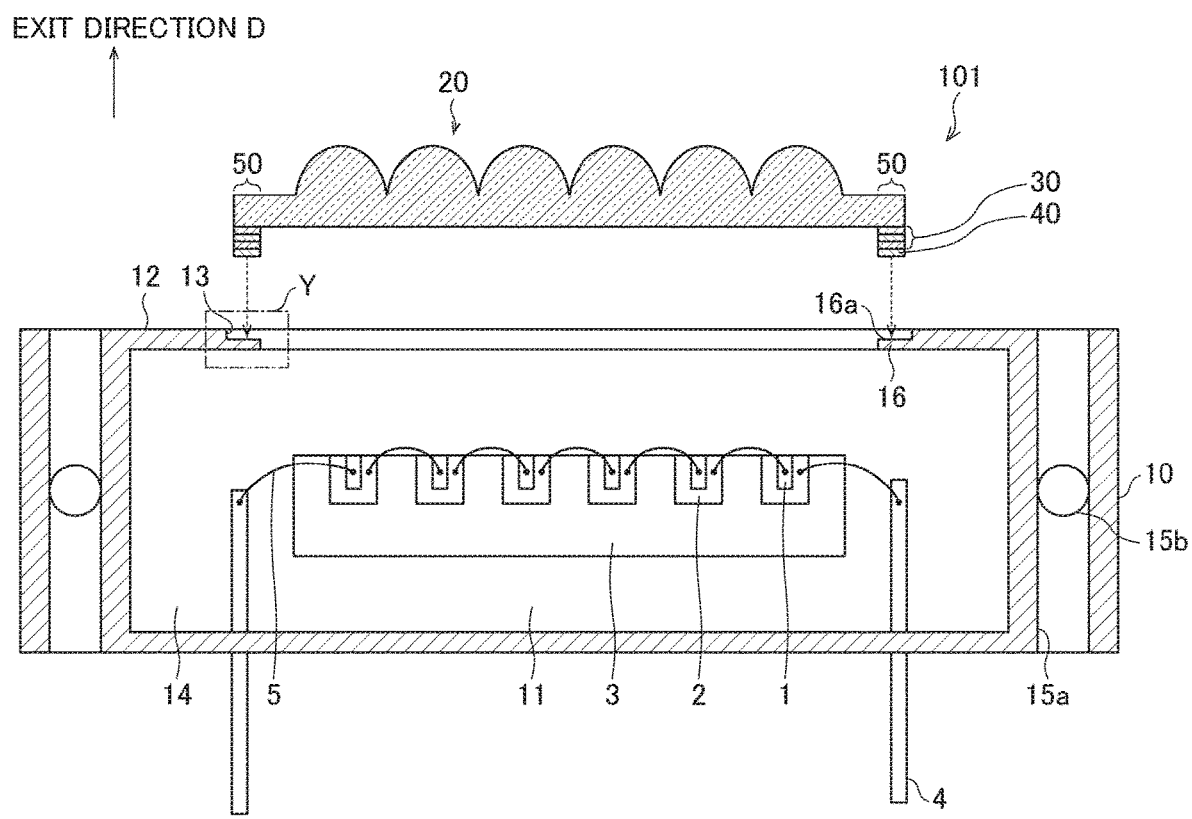
FIG. 8 is a sectional view of an example schematic configuration of a light-emitting apparatus according to a second preferred embodiment of the present invention.
Figure 9:
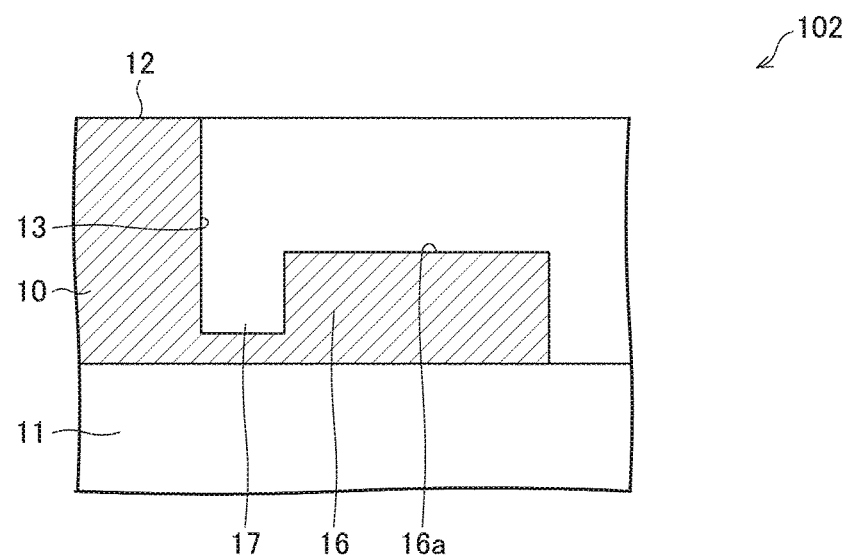
FIG. 9 is a partially enlarged sectional view of an example schematic configuration of a light-emitting apparatus according to a third preferred embodiment of the present invention.

FIG. 8 is a sectional view of an example schematic configuration of a light-emitting apparatus 101 according to the second preferred embodiment of the present invention. For easy description, FIG. 8 shows the body 10 and lens array 20 before joining. As a matter of fact, the lens array 20 is moved in the direction of the arrow to be thus placed on the body 10, and part of the base layer 30 and at least part of the solder layer 40 are alloyed together in the joint region 50. This forms the light-emitting apparatus 101. FIG. 9 is illustrated similarly. As illustrated in FIG. 8, the light-emitting apparatus 101 is the same as the light-emitting apparatus 100 with the exception that the body 10 of the light-emitting apparatus 101 has a counterbore part 16.

The counterbore part 16 is disposed in the exit surface 12 of the body 10 and extends around the opening 13. The counterbore part 16 is depressed downward from the exit surface 12 and has a bottom surface 16a substantially parallel to the exit surface 12. On the bottom surface 16a of the counterbore part 16, the lens array 20 is joined to the body 10.

Accordingly, forming the counterbore part 16 while reflecting, in advance, the positioning of the lens array 20, followed by joining the lens array 20 to the counterbore part 16 can seal the body 10 hermetically. This facilitates the positioning of the lens array 20 in sealing the body 10. In addition, this can reduce the thickness of the lens array 20 in the exit direction D, in which light emitted from the semiconductor laser elements 1 of the light-emitting apparatus 101 exits, thereby downsizing the light-emitting apparatus 101.

Third Preferred Embodiment

The following describes a third preferred embodiment of the present invention. The third preferred embodiment is a modification of the second preferred embodiment. FIG. 9 is a partially enlarged sectional view of an example schematic configuration of a light-emitting apparatus 102 according to the third preferred embodiment of the present invention. To be specific, FIG. 9 is an enlarged view of a portion corresponding to a region defined by a dot-dashed line Y in FIG. 8. As illustrated in FIG. 9, the light-emitting apparatus 102 is the same as the light-emitting apparatus 101 with the exception that the body 10 of the light-emitting apparatus 102 further has a groove 17 in the counterbore part 16.

The counterbore part 16 includes the groove 17 extending around the counterbore part 16 and made deeper than the bottom surface 16a of the counterbore part 16. In other words, the groove 17 is disposed between the counterbore part 16 and body 10 and is depressed in a direction opposite to the exit direction D, in which light emitted from the semiconductor laser elements 1 exits.

Figure 10:
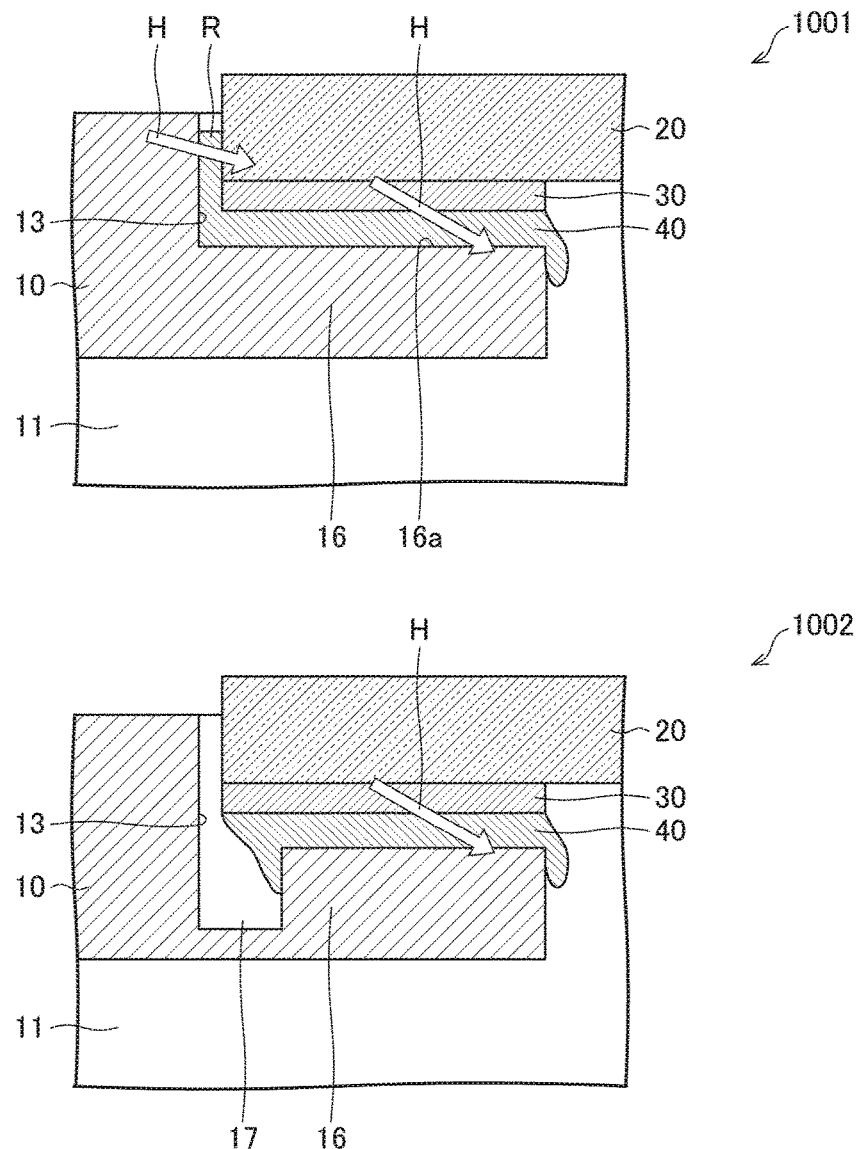
FIG. 10 illustrates an effect of a groove; an enlarged view 1001 shows how a lens array having no groove receives a stress from the solder layer, and an enlarged view 1002 shows how the lens array having the groove receives a stress from the solder layer.

FIG. 10 illustrates an effect of the groove 17. In FIG. 10, an enlarged view 1001 shows how the lens array 20 having no groove 17 receives a stress H from the solder layer 40, and an enlarged view 1002 shows how the lens array 20 having the groove 17 receives a stress H from the solder layer 40.

The body 10 and the lens array 20 are widely joined together through alloy formation. For this reason, increasing the thickness of the base layer 30 and the thickness of the solder layer 40 can absorb warping in each component as well as the roughness of the joint surface, thereby achieving stable joining.

In contrast, a simple counterbore structure as shown in the enlarged view 1001 possibly involves a portion R of the solder being able to wick, where solder spreads upward between the lens array 20 and body 10, at the time of joining the body 10 and lens array 20 together. The portion R of the solder that wicks upward may be generated relatively easier with the increase in the thicknesses of the base layer 30 and solder layer 40.

Such portion R, if generated, fills a space between the lens array 20 and body 10. Accordingly, the lens array 20 receives a stress H, produced when the body 10 contracts as a result of cooling of the joint region 50 after heating, not only from the bottom surface of the lens array 20, but also from the side surface of the lens array 20 between the lens array 20 and body 10. The lens array 20 is consequently more susceptible to cracking.

In contrast, providing the groove 17 allows the solder layer 40 to accumulate in the groove 17, thus not producing any portion R, as illustrated in the enlarged view 1002. The lens array 20 consequently receives a stress H, produced when the body 10 contracts, only from the bottom surface of the lens array 20. This can reduce the risk of damaging the lens array 20.

Summary

A light-emitting apparatus (100, 101, 102) according to a first aspect of the present invention includes a body (10) having an inner space (11) and an opening (13) penetrating the inner space and the outside. The body incorporates at least one semiconductor laser element (1) within the inner space and is made of a metal. The light-emitting apparatus also includes a sealing glass member (lens array 20) joined to the body so as to cover the opening, to hermetically seal the inner space of the body. The sealing glass member has a surface adjacent to the body. The surface of the sealing glass member is provided with a base joint layer (30X) in a joint region (50) where the sealing glass member and the body are joined together. The base joint layer is made of a metal having a thermal expansion coefficient that falls between the thermal expansion coefficient of the sealing glass member and the thermal expansion coefficient of the metal constituting the body. The sealing glass member is joined to the body with the base joint layer and a solder-containing joint layer (40X) interposed between the sealing glass member and the body.

In the foregoing configuration, the base joint layer is disposed on the surface of the sealing glass member adjacent to the body, and the sealing glass member is joined with the base joint layer and solder-containing joint layer interposed therebetween so as to cover the opening of the body, to thus hermetically seal the inner space of the body.

Further, the base joint layer is made of a metal having a thermal expansion coefficient that falls between the thermal expansion coefficient of the sealing glass member and the thermal expansion coefficient of the metal constituting the body. The base joint layer can thus reduce a thermal stress, which results from the difference in thermal expansion between the sealing glass member and body, when the sealing glass member and body undergo heating to be joined together. This enables the inner space of the body of the light-emitting apparatus to be sealed by the sealing glass member without damaging the sealing glass member even there is a large difference in thermal expansion between the sealing glass member and the body of the light-emitting apparatus.

The light-emitting apparatus (100, 101, 102) according to a second aspect of the present invention may be configured, in the first aspect, such that the sealing glass member (lens array 20) has a lens in a location through which light emitted from the at least one semiconductor laser element (1) passes.

The foregoing configuration enables the lens array to seal the body, thereby eliminating the need for considering where to put the lens array after sealing. The configuration also eliminates the need for providing a sealant separately, thereby saving sealants.

The light-emitting apparatus (100, 101, 102) according to a third aspect of the present invention may be configured, in the first or second aspect, such that the base joint layer (30X) includes an adherence layer (31) disposed on the surface of the sealing glass member (lens array 20), and a barrier layer (32) disposed on the adherence layer.

In the foregoing configuration, the barrier layer that is made of a suitably selected material can avoid mixing of the solder layer into the adherence layer when the sealing glass member and body undergo heating to be joined together. This can maintain the adhesion between the base joint layer and sealing glass member, thereby enabling the sealing glass member to seal the body firmly.

The light-emitting apparatus (100, 101, 102) according to a fourth aspect of the present invention may be configured, in the third aspect, such that the adherence layer (31) is made of a metal mainly containing chromium or titanium, and such that the barrier layer (32) is made of a metal mainly containing platinum. These materials in the foregoing configuration can be used suitably as the adherence layer and base layer.

The light-emitting apparatus (101) according to a fifth aspect of the present invention may be configured, in any of the first to fourth aspects, such that the body (10) has an outer surface (exit surface 12) provided with a counterbore part (16) extending around the opening (13), and such that the sealing glass member (lens array 20) is joined to the body on the bottom surface (16a) of the counterbore part.

In the foregoing configuration, joining the sealing glass member onto the bottom surface of the counterbore part can seal the inner space of the body, thereby facilitating the positioning of the sealing glass member. In addition, this joining can reduce the thickness of each semiconductor laser element of the light-emitting apparatus, thereby downsizing the light-emitting apparatus.

The light-emitting apparatus (102) according to a sixth aspect of the present invention may be configured, in the fifth aspect, such that the counterbore part (16) includes a groove (17) extending around the counterbore part and made deeper than the bottom surface (16a) of the counterbore part.

The foregoing configuration can avoid the solder layer from wicking up between the body and sealing glass member at the time of sealing, thereby avoiding the sealing glass member from receiving a stress from its side surface at the time of sealing. Consequently, the risk of damaging the sealing glass member can be further lowered.

The light-emitting apparatus (100, 101, 102) according to a seventh aspect of the present invention may be configured, in any of the first to sixth aspects, such that the at least one semiconductor laser element (1) includes a plurality of semiconductor laser elements (1), and such that the plurality of semiconductor laser elements are placed in the inner space (11) of the body (10).

The foregoing configuration achieves a light-emitting apparatus having a body that is sealable by a sealing glass member without damaging the sealing glass member even when a plurality of semiconductor laser elements are mounted on the light-emitting apparatus.

The light-emitting apparatus (100, 101, 102) according to an eighth aspect of the present invention may be configured, in any of the first to seventh aspects, such that the solder-containing joint layer (40X) is made of a metal mainly containing any one of gold, gold and tin, or tin, silver and copper. These materials in the foregoing configuration can be used suitably as the solder-containing joint layer.

The light-emitting apparatus (100, 101, 102) according to a ninth aspect of the present invention may be configured, in any of the first to eighth aspects, such that the body (10) mainly contains copper. In the foregoing configuration, the major constituent of the body is copper, thereby achieving suitable dissipation of heat radiated from the semiconductor laser element.

The light-emitting apparatus (100, 101, 102) according to a tenth aspect of the present invention may be configured, in any of the first to ninth aspects, such that the body (10) has a surface covered, at least in the joint region (50), with gold. The foregoing configuration achieves suitable joining to the solder layer.

A method for manufacturing a light-emitting apparatus (100, 101, 102) according to an eleventh aspect of the present invention includes joining a sealing glass member (lens array 20) to a body (10) so as to cover an opening (13), to hermetically seal an inner space (11) of the body. The body has the inner space, and the opening penetrating the inner space and the outside. The body incorporates at least one semiconductor laser element (1) within the inner space and is made of a metal. The sealing glass member has a surface (23) adjacent to the body. The surface of the sealing glass member is provided with a base layer (30) with a joint region (50) patterned in advance, and a solder layer (40) disposed on the base layer. The joint region includes the sealing glass member and the body joined together. The base layer is made of a metal having a thermal expansion coefficient that falls between the thermal expansion coefficient of the sealing glass member and the thermal expansion coefficient of the metal constituting the body. The base layer includes an adherence layer (31) disposed on the surface of the sealing glass member, a barrier layer (32) disposed on the adherence layer, and a metal joint layer (33) disposed on the barrier layer. The body has a surface covered, at least in the joint region, with a gold layer in advance. The joining step includes heating the joint region to alloy the metal joint layer and the solder layer together and alloy the solder layer and the gold layer together. The foregoing configuration achieves an effect similar to that described in the first aspect.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A light-emitting apparatus comprising:
a body having an inner space and an opening penetrating the inner space and an outside, the body incorporating at least one semiconductor laser element within the inner space, the body being made of a metal; and
a sealing glass member joined to the body so as to cover the opening to hermetically seal the inner space of the body,
wherein the sealing glass member has a surface adjacent to the body, the surface of the sealing glass member being provided with a base joint layer in a joint region where the sealing glass member and the body are joined together, the base joint layer being made of a metal having a thermal expansion coefficient that falls between a thermal expansion coefficient of the sealing glass member and a thermal expansion coefficient of the metal forming the body,
the sealing glass member is joined to the body with the base joint layer and a solder-containing joint layer interposed between the sealing glass member and the body,
the body has an outer surface provided with a counterbore part extending around the opening, and
the sealing glass member is joined to the body on a bottom surface of the counterbore part.

2. The light-emitting apparatus according to claim 1, wherein the sealing glass member further has a lens in a location through which light emitted from the at least one semiconductor laser element passes.

3. The light-emitting apparatus according to claim 1, wherein the base joint layer has
an adherence layer disposed on the surface of the sealing glass member, and
a barrier layer disposed on the adherence layer.

4. The light-emitting apparatus according to claim 3, wherein
the adherence layer is made of a metal mainly containing chromium or titanium, and
the barrier layer is made of a metal mainly containing platinum.

5. The light-emitting apparatus according to claim 1, wherein the counterbore part includes a groove extending around the counterbore part and made deeper than the bottom surface of the counterbore part.

6. The light-emitting apparatus according to claim 1, wherein
the at least one semiconductor laser element comprises a plurality of semiconductor laser elements, and
the plurality of semiconductor laser elements is placed in the inner space of the body.

7. The light-emitting apparatus according to claim 1, wherein the solder-containing joint layer is made of a metal mainly containing any one of gold, gold and tin, or tin, silver and copper.

8. The light-emitting apparatus according to claim 1, wherein the body mainly contains copper.

9. The light-emitting apparatus according to claim 1, wherein the body further has a surface covered, at least in the joint region, with gold.

10. A method for manufacturing a light-emitting apparatus, the method comprising:

joining a sealing glass member to a body so as to cover an opening to hermetically seal an inner space of the body, wherein the body has the inner space and the opening penetrating the inner space and an outside, the body incorporating at least one semiconductor laser element within the inner space, the body being made of a metal, the sealing glass member has a surface adjacent to the body, the surface of the sealing glass member being provided with a base layer with a joint region patterned in advance, and a solder layer disposed on the base layer, the joint region including the sealing glass member and the body joined together, the base layer is made of a metal having a thermal expansion coefficient that falls between a thermal expansion coefficient of the sealing glass member and a thermal expansion coefficient of the metal forming the body, the base layer includes:
  an adherence layer disposed on the surface of the sealing glass member,
  a barrier layer disposed on the adherence layer, and
  a metal joint layer disposed on the barrier layer, the body further has a surface covered, at least in the joint region, with a gold layer in advance, the joining of the sealing glass member to the body includes heating the joint region to alloy the metal joint layer and the solder layer together and to alloy the solder layer and the gold layer together, the body has an outer surface provided with a counterbore part extending around the opening, and the sealing glass member is joined to the body on a bottom surface of the counterbore part.

* * * * *